United States Patent
Botker

(10) Patent No.: US 6,639,460 B1
(45) Date of Patent: Oct. 28, 2003

(54) RESIDUAL OFFSET CORRECTION METHOD AND CIRCUIT FOR CHOPPER STABILIZED AMPLIFIERS

(75) Inventor: Thomas L. Botker, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/123,981

(22) Filed: Apr. 16, 2002

(51) Int. Cl.[7] .............................................. H03F 1/02
(52) U.S. Cl. .............................. 330/9; 330/51; 330/69; 327/124
(58) Field of Search ........................ 330/9, 69, 51; 327/124, 307

(56) References Cited

U.S. PATENT DOCUMENTS

| | | | | |
|---|---|---|---|---|
| 6,242,974 B1 | * | 6/2001 | Kunst | 330/9 |
| 6,380,801 B1 | * | 4/2002 | McCartney | 330/9 |
| 6,456,159 B1 | * | 9/2002 | Brewer | 330/9 |

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

An improved circuit and technique are provided that facilitate residual offset correction during chopper stabilization of an amplifier circuit. A chopper stabilized amplifier can be configured with an additional gain stage configured between input and following stages of the amplifier. Instead of a second switching block being configured on the output of the input stage, the second switching block is coupled to the output of the additional gain stage. As a result, the offset voltage of the additional gain stage appears across the output of the input stage in the same polarity during chopper stabilization. Thus, the offset voltage that appears across the output of the input stage remains constant at the end of each of the chopping phases. Accordingly, any residual offset voltage, for example that due to changes in voltage across parasitic capacitances on the output of the input stage, can be eliminated. In addition, a feedforward stage can be configured around the additional gain stage to facilitate increased overall stability in the amplifier.

21 Claims, 6 Drawing Sheets

RESIDUAL OFFSET CORRECTION METHOD AND CIRCUIT FOR CHOPPER STABILIZED AMPLIFIERS

FIELD OF INVENTION

The present invention relates to operational amplifiers. More particularly, the present invention relates to a technique and circuit for providing residual offset correction in a chopper stabilized amplifier circuit.

BACKGROUND OF THE INVENTION

The demand for improved operational amplifiers, and in particular instrumentation amplifier circuits for high-precision data acquisition and instrumentation applications, such as multi-channel data acquisition systems, current shunt monitors, and industrial or physiological sensors, continues to increase. Instrumentation amplifier circuits are generally designed to amplify the difference between two voltage inputs with a defined gain, wherein a single-ended output is provided which is referenced to a known reference point, for example, ground.

Such operational amplifier circuits generally include an input stage circuit and an output stage circuit comprised of various amplifier devices and other current sources. To facilitate the reduction of error caused by mismatch of transistor devices within the various amplifier and/or current sources, operational amplifier circuits are being configured with chopper stabilization. In this technique, a pair of commutating switch blocks can be configured at the input and output of an input stage circuit in a manner to zero the voltage offset of the input stage. During operation, the switching block is configured to reverse the polarity of an input offset voltage during alternating phases, which operates to stabilize the voltage offset of the input stage. In addition, chopper stabilization can also reduce input referred low frequency noise.

For example, with reference to FIG. 1, an operational amplifier circuit 100 configured with chopper stabilization is illustrated. Amplifier circuit 100 includes an input stage 102 and an output stage 104 configured with a feedback arrangement 110. Input stage 102 includes an input pair of transistors $M_1$ and $M_2$ configured to receive the input voltage, and a second pair of transistors $M_A$ and $M_B$ and a third pair of transistors $M_C$ and $M_D$ configured to provide output terminals $V_{O1}$ and $V_{O2}$.

To facilitate the chopper stabilization process, amplifier circuit 100 includes a switching block 106 at the input of input stage 102 and a switching block 108 at the output of input stage 102. Switching block 106 is configured to receive a differential input voltage at two input terminals, $V_1$ and $V_2$, and through the use of two paths as determined by the closure of the switches during a first phase and a second phase, to chop the input signal at a desired chopping frequency. Switching blocks 106 and 108 are configured for modulation of the input offset voltage to provide for the reduction of offset errors due to input stage 102. Although not shown, a common-mode feedback loop is used for a differential output configuration of input stage 102.

For example, during a first phase, i.e., when switches designated as A are opened and switches designated as B are closed, an input voltage at $V_1$ crosses over through one of the B switches to the gate of input transistor $M_2$, while an input voltage at $V_2$ crosses over through another of the B switches to the gate of input transistor $M_1$. As a result, the input voltage at $V_1$ ends up at output terminal $V_{O1}$, and through closure of the B switches in switching block 108, at the positive terminal of output stage 104, while the input voltage at $V_2$ ends up at output terminal $V_{O2}$, and thus at the negative terminal of output stage 104.

During a second phase, i.e., when switches designated as B are opened and switches designated as A are closed, the input voltage at $V_1$ passes through one of the A switches to the gate of input transistor $M_1$, while the input voltage at $V_2$ passes through another of the A switches to the gate of input transistor $M_2$. As a result, the input voltage at $V_1$ ends up at output terminal $V_{O2}$, and through closure of the A switches in switching block 108, again at the positive terminal of output stage 104, while the input voltage at $V_2$ ends up at output terminal $V_{O1}$, i.e., again at the negative terminal of output stage 104.

Accordingly, while the differential input voltage, i.e., the voltage difference at terminals $V_1$ and $V_2$, can be suitably provided to the input terminals of output stage 104, an input offset voltage $V_{OS1}$, occurring from input stage 102 can be suitably chopped out by switching blocks 106 and 108.

Another characteristic of input stage 102 is the inclusion of parasitic capacitances at the output that can be the source of additional offset error. For example, input stage 102 can include a parasitic capacitance $C_{P1}$ at output terminal $V_{O1}$ and a parasitic capacitance $C_{P2}$ at output terminal $V_{O2}$. For simplicity, a dual supply configuration is illustrated for input stage 102. During the first phase, an offset voltage $V_{OS2}$ of output stage 104 can comprise, for example, a one millivolt signal at the positive input terminal, i.e., at output terminal $V_{O1}$, and a zero volt signal at the negative input terminal, i.e., at output terminal $V_{O2}$. Thus, an offset voltage $V_{OS2}$ of one millivolt can occur differentially between parasitic capacitances $C_{P1}$ and $C_{P2}$.

However, during the second phase, the polarity of offset voltage $V_{OS2}$ occurring differentially between parasitic capacitances $C_{P1}$ and $C_{P2}$ is switched, resulting in a voltage change across parasitic capacitances $C_{P1}$ and $C_{P2}$. As a result of this voltage change, current will flow out of parasitic capacitances $C_{P1}$ and $C_{P2}$ and into transistors $M_A$ and $M_B$. Due to the feedback configuration, the current resulting from the voltage change will then flow to input transistors $M_1$ and $M_2$, which have some input transconductance $g_m$, and will result in additional DC offset voltage that is not chopped out by the chopper stabilization switching blocks 106 and 108. In other words, a residual DC offset term results from a change in voltage at the output of input stage 102, due to offset voltage $V_{OS2}$ reacting with parasitic capacitances $C_{P1}$ and $C_{P2}$, that is not corrected by current chopper stabilization techniques. In addition, the input offset voltage increases at higher chopping frequencies, i.e., the faster the operation of switching blocks 106 and 108, the more current that flows to input transistors $M_1$ and $M_2$, and the greater the DC offset error that exists. Thus, while amplifier circuit 100 can provide suitable chopper stabilization at low switching frequencies, significant input offset error occurs at higher switching frequencies.

Accordingly, a need exists for a offset correction technique for residual offset occurring in chopper stabilized amplifiers.

SUMMARY OF THE INVENTION

The method and circuit according to the present invention addresses many of the shortcomings of the prior art. In accordance with various aspects of the present invention, a circuit and technique are provided that facilitate residual offset correction during chopper stabilization of an operational amplifier circuit.

In accordance with an exemplary embodiment, a chopper stabilized operational amplifier can be configured with an additional gain stage configured between input and output stages of the operational amplifier. In this exemplary embodiment, instead of a second switching block being configured on the output of the input stage, the second switching block is coupled to the output of the additional gain stage. As a result, any input offset voltage of the additional gain stage appears across the output of the input stage with the same polarity during chopper stabilization. Thus, the offset voltage that appears across the output of the input stage remains constant at the end of each of the chopping phases. Accordingly, any residual offset voltage, for example that due to changes in voltage across parasitic capacitances on the output of the input stage, can be eliminated.

In accordance with another exemplary embodiment, a feedforward stage can be configured around the additional gain stage to facilitate increased overall stability in the operational amplifier. In addition, a third switching block can be configured with the feedforward stage to facilitate a negative feedback arrangement through the feedforward stage during operation.

BRIEF DESCRIPTION OF THE DRAWINGS

A more complete understanding of the present invention may be derived by referring at to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
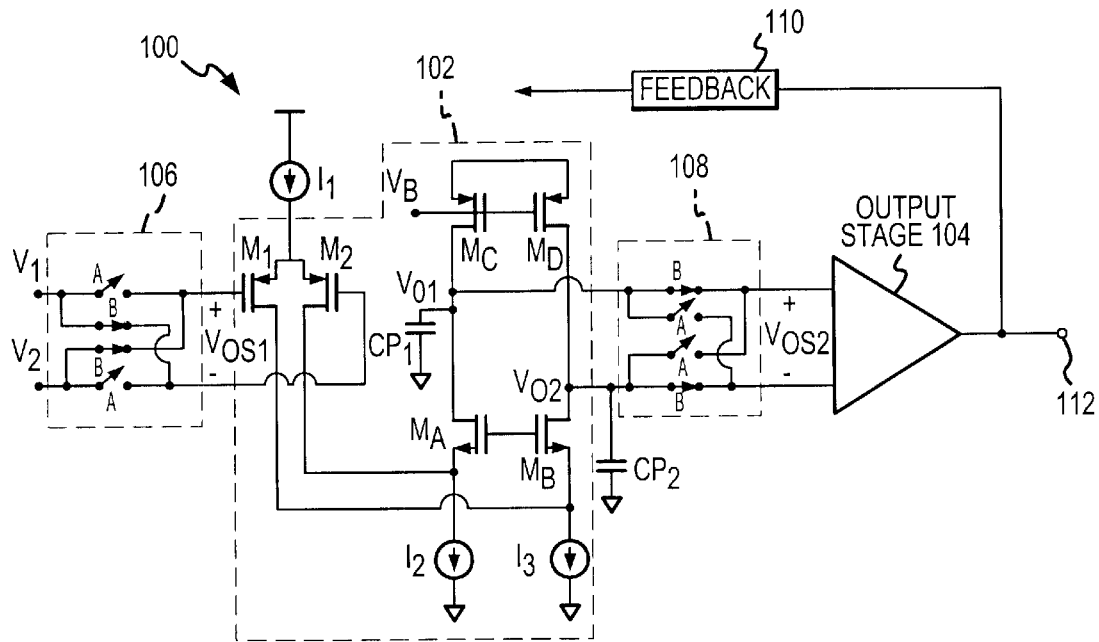
FIG. 1 illustrates a schematic diagram of a prior art chopper stabilized operational amplifier circuit.

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with chopper stabilized circuits for use with an operational amplifier. Further, it should be noted that while various components may be suitably coupled or connected to other components within exemplary circuits, such connections and couplings can be realized by direct connection between components, or by connection through other components and devices located thereinbetween.

As discussed above, currently available chopper stabilization configurations for use in operational amplifiers include a residual DC offset term that is not corrected by such current chopper stabilization techniques when operating at higher switching frequencies. This residual offset term results from a change in voltage at the output of the input stage that occurs due to offset voltage of the following stage, e.g., an output stage, reacting with parasitic capacitances at the output of the input stage. However, in accordance with various aspects of the present invention, a circuit and technique are provided that facilitate residual offset correction during chopper stabilization of an operational amplifier circuit.

In accordance with an exemplary embodiment, a chopper stabilized operational amplifier having an input stage and a following stage, such as an output stage, can be configured with an additional gain stage configured between the input and following stages. For chopper stabilization, a first switching block is configured at the input of the input stage. However, instead of a second switching block being configured at the output of the input stage, the second switching block is coupled to the output of the additional gain stage. As a result, the offset voltage of the additional gain stage appears across the output of the input stage in the same polarity during chopper stabilization, regardless of the chopping phase of the second switching block, and thus remains constant at the end of each of the chopping phases. Accordingly, any residual offset voltage, for example that due to changes in voltage across parasitic capacitances on the output of the input stage, can be eliminated.

Figure 4:
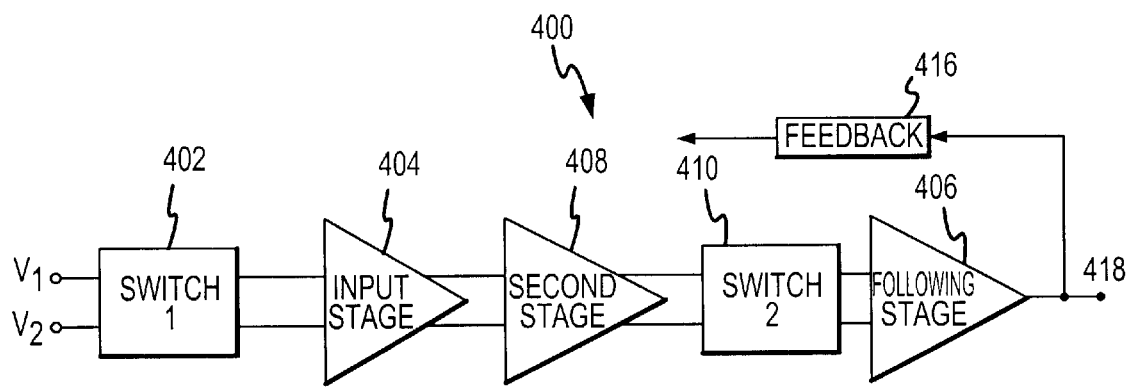
FIG. 4 illustrates a block diagram of an exemplary embodiment of a chopper stabilized operational amplifier circuit in accordance with the present invention.

For example, with reference to FIG. 4, a block diagram of an exemplary chopper stabilized operational amplifier circuit 400 is illustrated. Operational amplifier 400 suitably comprises an input stage 404 and at least one following stage 406, with a first switching block 402 configured at the input of input stage 404, and a second switching block 410 configured at the input of following stage 406. In addition, operational amplifier 400 can also include a feedback configuration 416 for providing buffer-like or any other feedback configuration operation. Further, to facilitate elimination of the residual DC offset error that can occur in chopper stabilized amplifiers, a second or additional stage 408 is configured between input stage 404 and following stage 406.

Input stage 404 suitably comprises any type of input stage configuration. For example, input stage 404 can comprise a PMOS input pair of transistors having NMOS loads, an NMOS input pair of transistors having PMOS loads, or any other input stage configuration. In the exemplary embodiment, input stage 404 has two input terminals and two output terminals. For example, with reference to FIG. 5, an operational amplifier 500 can include an input stage 504 that comprises a pair of PMOS input transistors $M_1$ and $M_2$ having two input terminals, i.e., the gate terminals of transistors $M_1$ and $M_2$, coupled to the input voltage at terminals $V_1$ and $V_2$ through first switching block 502. In addition, loading can be facilitated by NMOS transistors $M_A$ and $M_B$, the sources of which are coupled to the drains of transistors $M_1$ and $M_2$, current source devices $M_C$ and $M_D$ comprising PMOS transistors, the drains of which are coupled to the drains of transistors $M_A$ and $M_B$, and current sources $I_2$ and $I_3$, which are coupled to the sources of transistors $M_A$ and $M_B$, i.e., to the drains of transistors $M_1$ and $M_2$. In addition, transistors $M_A$ and $M_B$ and transistors $M_C$ and $M_D$ are configured with a bias voltage. Thus, two output terminals, $V_{O1}$ and $V_{O2}$, can be provided at the drains of transistors $M_A$ and $M_B$ and transistors $M_C$ and $M_D$. Further, as discussed above, input stage 504 includes parasitic capacitances $C_{P1}$ and $C_{P2}$ configured at the output terminals $V_{O1}$ and $V_{O2}$. Parasitic capacitances $C_{P1}$ and $C_{P2}$ results from the various devices within input stage 504, as well as from capacitances resulting due to the layout metal traces on output terminals $V_{O1}$ and $V_{02}$.

Following stage 406 suitably comprises any gain stage configuration. For example, following stage 406 can comprise an output stage, or any other stage configured to follow second switching block 410. While FIG. 4 illustrates a single following stage 406, it should be noted that various additional following stages 406 can be configured within amplifier circuit 400 to suitably follow one another, e.g., an output stage can suitably follow a first following stage 406. In the exemplary embodiment, following stage 406 includes two input terminals and a single-ended output terminal; however, following stage 406 could also be configured with a differential output as well.

First switching block 402 is configured to receive a differential input voltage at two input terminals, $V_1$ and $V_2$, and to modulate the differential input voltage up to the clock frequency. Second switching block 410 is configured for modulation of the input offset voltage to provide for the reduction of offset errors occurring at input stage 404, as well as the reduction of noise occurring at low frequency, and the demodulation of the input signal. Switching blocks 402 and 410 can comprise various switching configurations for providing chopper stabilization.

Figure 5:
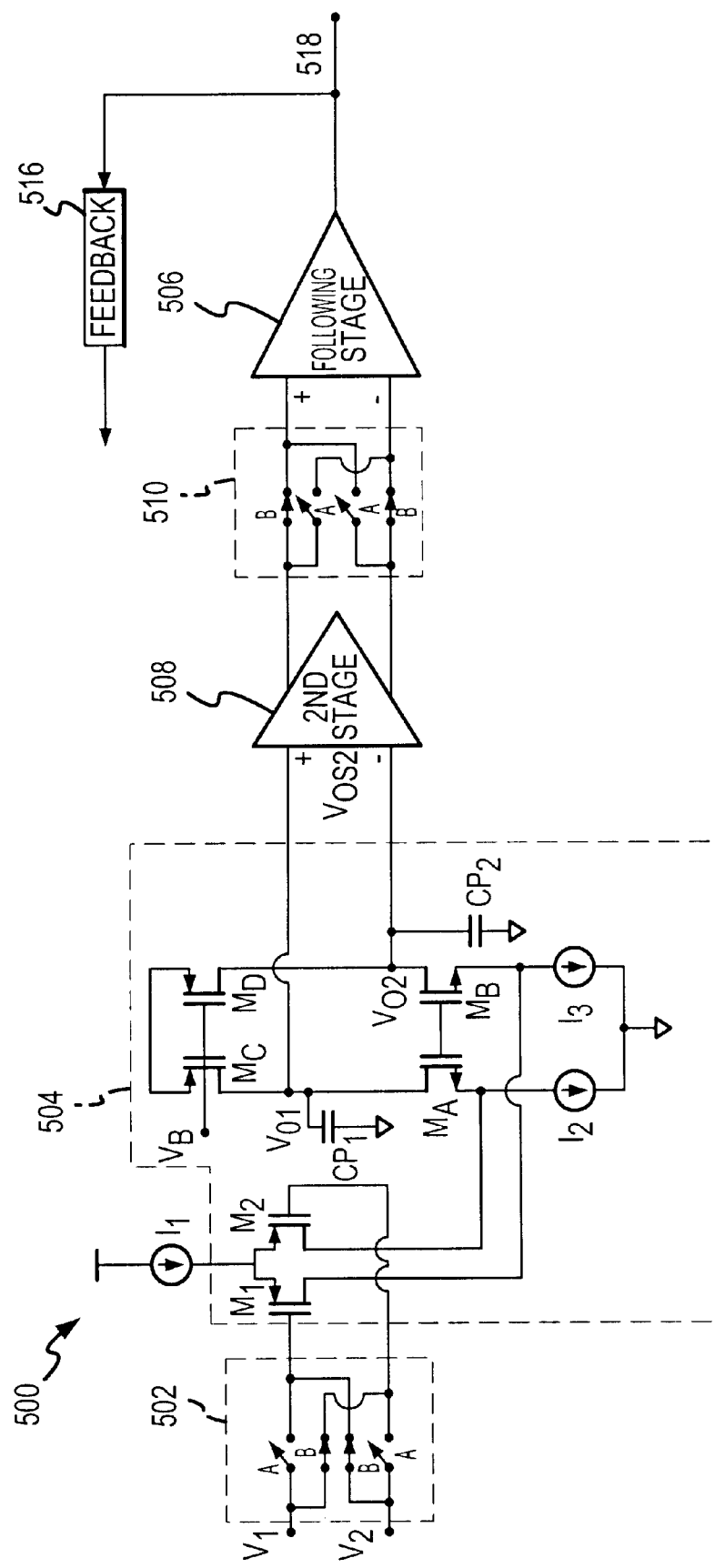
FIG. 5 illustrates a schematic diagram of an exemplary embodiment of a chopper stabilized operational amplifier circuit in accordance with the present invention.

For example, with reference to FIG. 5, a first switching block 502 and a second switching block 510 can be provided with two paths corresponding to two chopping phases, e.g., with the A or B switches appropriately opened or closed. In addition, each of first switching block 502 and second switching block 510 can be configured to receive two input signals and provide two output signals. Moreover, first switching block 502 and second switching block 510 can comprise various transistor devices and configurations.

Figure 2:
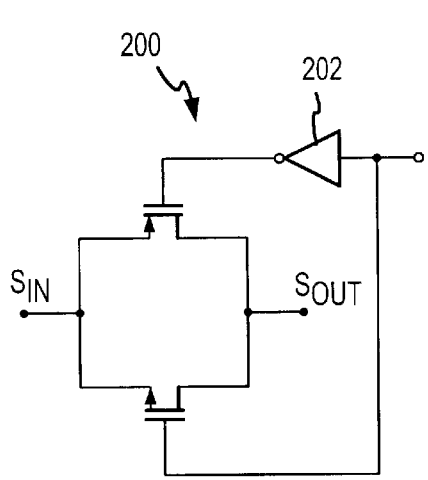
FIG. 2 illustrates a schematic diagram of an exemplary switching circuit in accordance with an exemplary embodiment of the present invention.

In accordance with an exemplary embodiment, first switching block 502 can comprise a PMOS, NMOS transmission gate configuration. For example, with reference to FIG. 2, each switch A and B of first switching block 502 can comprise a switching device 200 including a PMOS device and an NMOS device and an inverter 202 for driving the PMOS, NMOS transmission gates. In accordance with an exemplary embodiment, the NMOS device has a gate coupled to an input of inverter 202, while the PMOS device has a gate coupled to an inverted output of inverter 202. In addition, an input terminal $S_{IN}$ is coupled to the sources of the PMOS and NMOS devices, and an output terminal $S_{OUT}$ is coupled to the drains of the PMOS and NMOS devices. As a result, a plurality of PMOS, NMOS switching devices 200 can be configured to provide the two phase, two input/output operation of first switching block 502. In addition, in accordance with another exemplary embodiment, the PMOS device can have a gate coupled to the input of inverter 202, while the NMOS device can have a gate coupled to the inverted out put of inverter 202.

Figure 3:
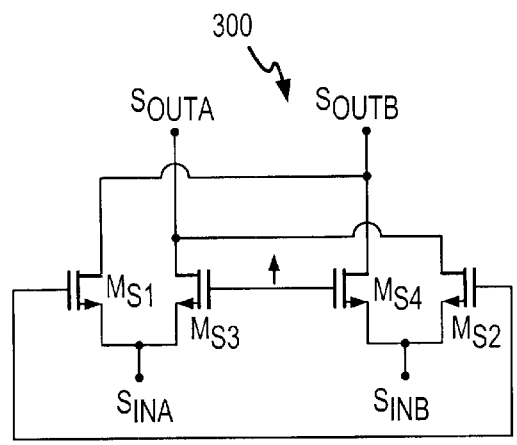
FIG. 3 illustrates a schematic diagram of another exemplary switching circuit in accordance with an exemplary embodiment of the present invention.

Second switching block 510 can also comprise various configurations. For example, second switching block 510 can comprise a plurality of PMOS, NMOS switching devices 200 similar to first switching block 502. In addition, in accordance with an exemplary embodiment, second switching block 510 can suitably comprise only NMOS transistor devices since the common mode voltage on the input of second switching block 510 may not require PMOS devices. For example, with reference to FIG. 3, a second switching block 300 comprises a plurality of NMOS transistors including an inner first pair of transistors $M_{S3}$ and $M_{S4}$ having respective gates connected together, and an outer second pair of transistors $M_{S1}$ and $M_{S2}$ having respective gates connected together. In addition, input terminals $S_{INA}$ and $S_{INB}$ are coupled to the sources of transistors $M_{S1}$ and $M_{S3}$ and to transistors $M_{S2}$ and $M_{S4}$, respectively, for operation during both phases A and B. Further, output terminals $S_{OUTA}$ and $S_{OUTB}$ are coupled to the drains of transistors $M_{S3}$ and $M_{S2}$ and to transistors $M_{S4}$ and $M_{S1}$, respectively, for operation during both phases A and B.

With the NMOS configured devices, second switching block 300 is configured such that when inner gates $M_{S3}$ and $M_{S4}$ are high, outer gates $M_{S1}$ and $M_{S2}$ are low. Thus, during a first phase, when inner gates $M_{S3}$ and $M_{S4}$ are high, input terminal $S_{INA}$ is coupled to output terminal $S_{OUTA}$ and input terminal $S_{INB}$ is coupled to output terminal $S_{OUTB}$. During a second phase, when inner gates $M_{S3}$ and $M_{S4}$ are low and outer gates $M_{S1}$ and $M_{S2}$ are high, input terminal $S_{INA}$ is coupled to output terminal $S_{OUTB}$ and input terminal $S_{INB}$ is coupled to output terminal $S_{OUTA}$. As a result, switching block 300 can be configured to provide the two phase, two input/output operation of second switching block 510.

With reference again to FIG. 4, to facilitate elimination of the residual DC offset error that can occur in chopper stabilized amplifiers, operational amplifier 400 suitably comprises a second or additional stage 408 configured between input stage 404 and following stage 406. In accordance with the exemplary embodiment, second stage 408 is configured prior to switching block 410, i.e., at the output of input stage 404. Second stage 408 suitably comprises an amplifier gain stage having two input terminals and two output terminals. As a result, any offset voltage of second stage 408 appears across the output of input stage 404 with the same polarity during each of the phases of chopper stabilization, i.e., regardless of the chopping phase. In accordance with an exemplary embodiment, second stage 408 comprises an auto-zero stage configured such that second stage 408 has zero input offset. As a result, such a configuration provides no charge across parasitic capacitances $C_{P1}$ and $C_{P2}$ between phases that otherwise result in residual offset.

With reference to FIG. 5, an exemplary second stage 508 includes a positive input terminal directly connected to output terminal $V_{O1}$ and a negative input terminal directly connected to output terminal $V_{O2}$. Further, two output terminals are provided by second stage 508 to switching block 510, e.g., to switch A and switch B, for coupling to following stage 506. Any offset voltage occurring at the input of second stage 508 suitably appears at output terminals $V_{O1}$ and $V_{O2}$ with the same polarity during each phase of the chopping stabilization process. In other words, the configuration of second stage 508 forces the same voltage to appear across parasitic capacitances $C_{P1}$ and $C_{P2}$ configured at output terminals $V_{O1}$ and $V_{O2}$. Accordingly, any residual offset error is eliminated.

Figure 6:
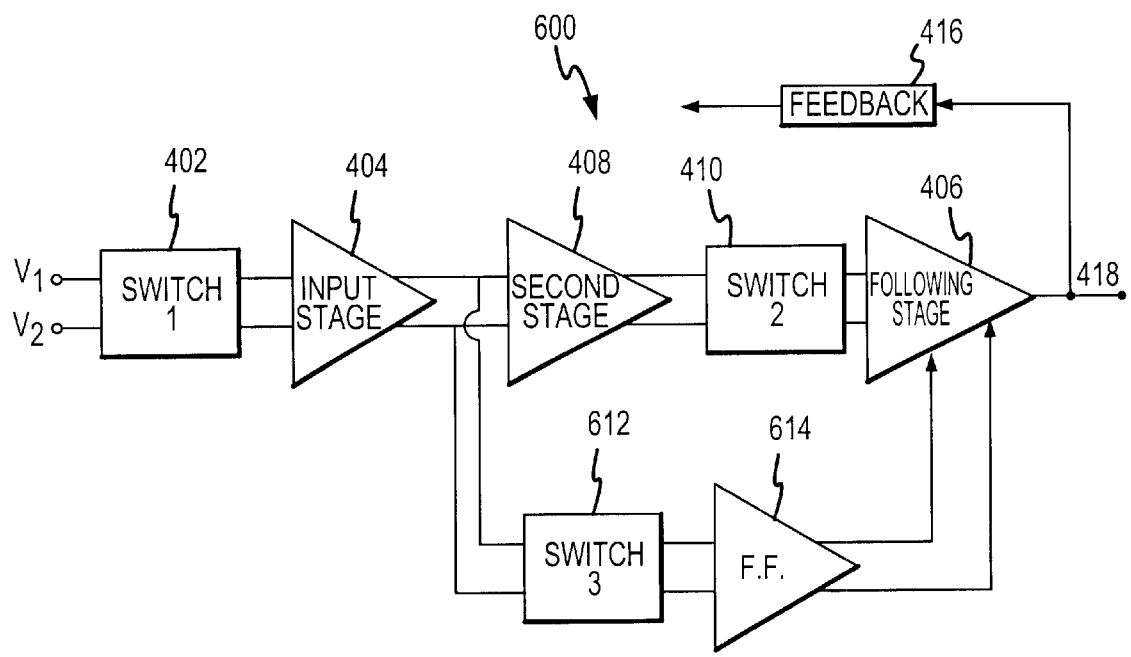
FIG. 6 illustrates a block diagram of an exemplary embodiment of a chopper stabilized operational amplifier circuit configured with a local feedforward stage in accordance with the present invention.

As discussed above with reference to FIG. 4, second stage 408 is coupled to following stage 406 through second switching block 410. While such a configuration can facilitate a correct output signal at output terminal 418, the addition of second stage 408 can result in instability within operational amplifier circuit 400. However, in accordance with another exemplary embodiment, a feedforward stage can be configured around second stage 408 to facilitate increased overall stability in the operational amplifier. For example, with reference to FIG. 6, an amplifier circuit 600 suitably comprises a local feedforward stage 614 configured between the input of second stage 408 and following stage 406. Feedforward stage 614 can be coupled to following stage 406 to sum with following stage 406 to provide an output signal at output terminal 418. Feedforward stage 614 can comprise any configuration capable of providing feedforward functions. In the exemplary embodiment, feedforward stage 614 includes a positive and negative input terminal, and dual output terminals summed with following stage 406. However, feedforward stage 614 can also include a single-ended output terminal.

Figure 7:
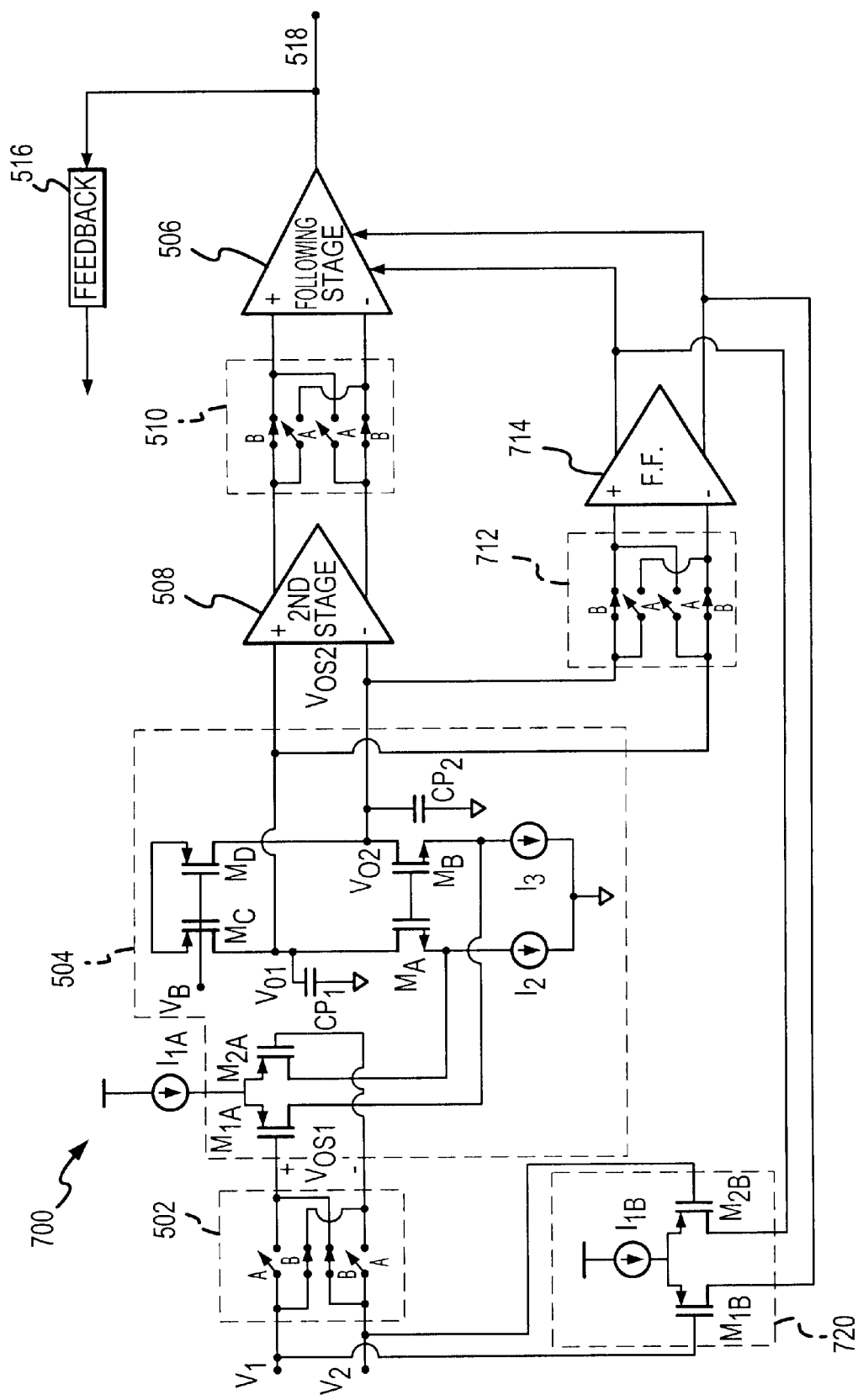
FIG. 7 illustrates a schematic diagram of an exemplary embodiment of a chopper stabilized operational amplifier circuit configured with an overall feedforward stage in accordance with the present invention.

In an exemplary embodiment, operational amplifier 600 is configured to provide negative feedback through local feedforward stage 614. Thus, operational amplifier 600 also includes a third switching block 612 configured between the input of second stage 408 and following stage 406, e.g., third switching block 612 can be connected to the input to feedforward stage 614, or connected to the output of feed forward stage 614. Through operation of third switching block 612, the feedforward path can be maintained for negative feedback through feedforward stage 614 through the appropriate flipping of switches within switching block 612 during the chopper phases of switching blocks 402 and 410. For example, with reference to FIG. 7, a third switching block 712 can comprise a pair of switches A and a pair of switches B, such as provided by second switching block 510 of FIG. 5. In this exemplary embodiment, third switching block 712 is configured such that during a first phase, i.e., with B switches closed, output terminal $V_{O2}$ of input stage 504 is coupled to the negative input terminal of second stage 508 and to the positive input terminal of a local feedforward stage 714, while output terminal $V_{O1}$ of input stage 504 is coupled to the positive input terminal of second stage 508 and to the negative input terminal of feedforward stage 714.

Third switching block 712 can comprise various switching devices and configurations. For example, third switching block 712 can comprise a plurality of PMOS, NMOS switching devices 200. In addition, third switching block 712 can also suitably comprise a switching block configuration 300 including an inner and outer pair of NMOS transistors.

To further increase the overall stability of amplifier 700, in addition to a local feedforward stage 714, an overall feedforward path 720 can also be included. For example, with reference to FIG. 7, an overall feedforward path 720 can be configured with a first pair of input transistors $M_{1A}$ and $M_{2A}$, similar to input transistors $M_1$ and $M_2$ illustrated in FIG. 5, and the feedforward path 720 can be configured with a second pair of input transistors $M_{1B}$ and $M_{2B}$. Transistors $M_{1B}$ and $M_{2B}$ are configured with sources coupled to an additional current source $I_{1B}$, gates coupled to input terminals $V_1$ and $V_2$, and drains coupled to following stage 506. As a result, additional compensation can be provided through overall feedforward path 720 to provide increased stability within amplifier 700.

Figure 8:
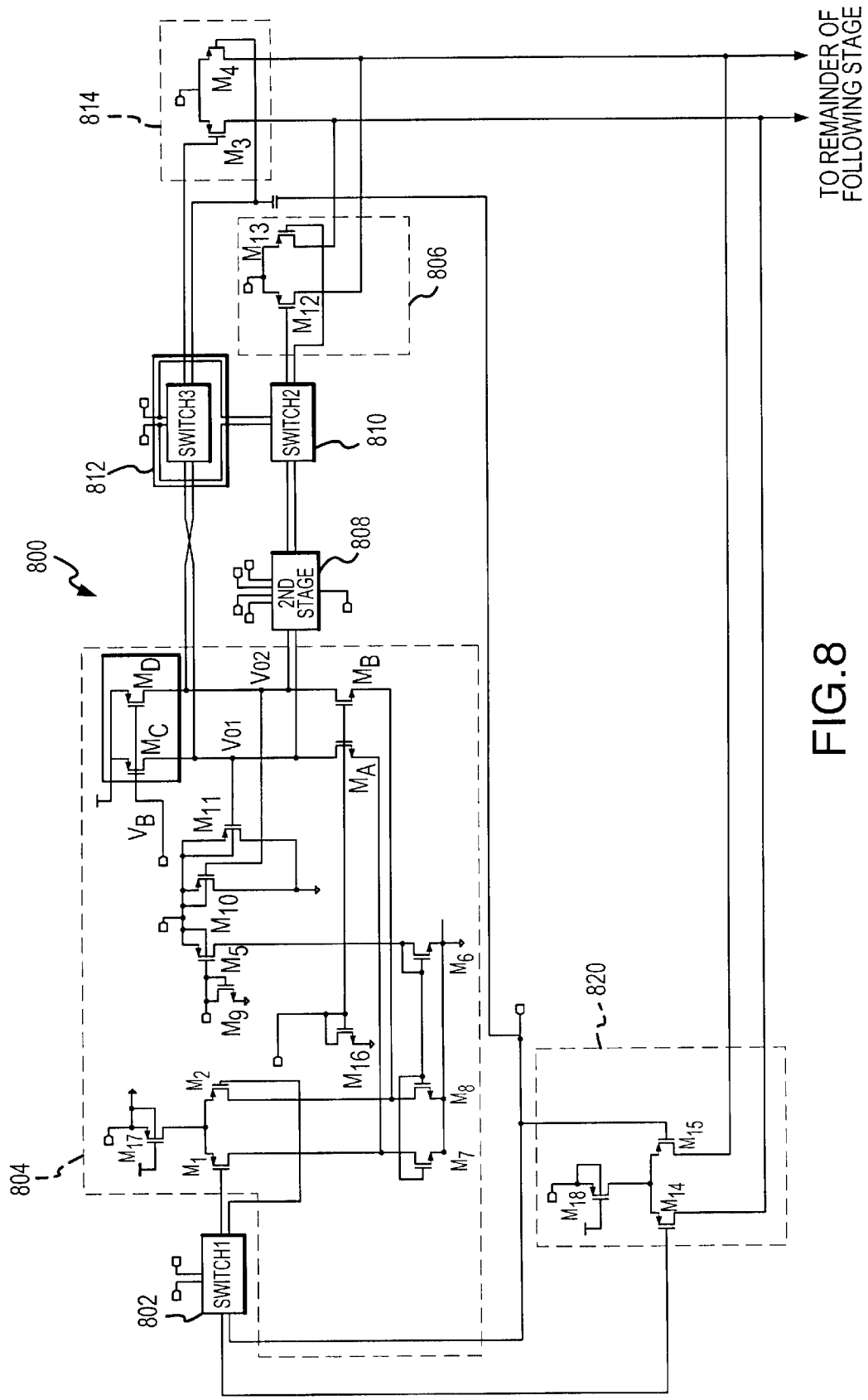
FIG. 8 illustrates a schematic diagram of another exemplary embodiment of a chopper stabilized operational amplifier in accordance with the present invention.

Having described various exemplary block diagrams and schematic diagrams of chopper stabilized amplifier circuits, an illustration of a more detailed chopper stabilized amplifier circuit in accordance with an exemplary embodiment of the present invention can be provided. With reference to FIG. 8, a chopper stabilized operational amplifier circuit 800 is illustrated. Chopper stabilized operational amplifier circuit 800 comprises an input stage 804, a portion of a following stage 806, a second stage 808, a local feedforward stage 814, an overall feedforward path 820, and a plurality of switching blocks 802, 810 and 812. In accordance with various exemplary embodiments, the various gain stages and switching blocks comprise various of the exemplary embodiments and features described above with respect to amplifier circuits 500 and 700.

In accordance with an exemplary embodiment, input stage 804 can also include a common-mode feedback path comprising transistors $M_5$, $M_6$, $M_7$, $M_8$, $M_9$, $M_{10}$ and $M_{11}$, with transistor $M_9$ configured to provide a bias point for driving the common-mode feedback path. A current source coupled to cascode transistor $M_{17}$ can be coupled to the sources of input transistors $M_1$ and $M_2$. In addition, transistors $M_{10}$ and $M_{11}$ can be provided to force the sum of the voltages at nodes $V_{O1}$ and $V_{O2}$ to the bias point provided by transistor $M_9$. Still further, a diode-connected transistor $M_{16}$ can be provided to facilitate driving of the gates of transistors $M_A$ and $M_B$ during operation. In addition, a portion of following stage 806 can comprise a differential pair of transistors $M_{12}$ and $M_{13}$ configured to provide a pair of output signals to the remainder of the following stage. Further, local feedforward stage 814 can also comprise a differential pair of transistors $M_3$ and $M_4$ configured to provide a differential output signal to the remainder of the following stage. Still further, overall feedforward stage 820 can comprise a differential pair of transistors $M_{14}$ and $M_{15}$ configured with a current source coupled to cascode transistor $M_{18}$, which can be coupled to the sources of transistors $M_{14}$ and $M_{15}$.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing JFET devices for the various switching devices. In addition, one or more additional stages may be included at the input or output of the second stage in accordance with various exemplary embodiments. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. An amplifier circuit configured for providing chopper stabilization while reducing residual offset errors, said operational amplifier circuit comprising:
   an input stage having an input offset voltage and providing an output signal at output terminals configured for chopper stabilization;
   a first switching block configured for chopper stabilizing of said amplifier circuit, said first switching block coupled to said input terminals of said input stage;

at least one following stage for providing an output signal;

a second switching block configured for chopper stabilizing of said amplifier circuit, said second switching block coupled to an input of said at least one following stage;

a second gain stage coupled between said input stage and said second switching block, wherein said second gain stage is configured such that any offset voltage occurring at an input of said second gain stage suitably appears at said output terminals of said input stage with identical polarity during each phase of chopper stabilization of said amplifier circuit, thus reducing any residual DC offset resulting from changes in voltage across parasitic capacitances on said output terminals of said input stage, and a local feedforward circuit, said local feedforward circuit comprising a feedforward stage coupled to said output terminals of said input stage and to said following stage, said feedforward stage being configured to increase stability within said amplifier circuit.

2. The amplifier circuit according to claim 1, wherein said local feedforward circuit further comprises a third switching block configured for providing negative feedback of said local feedforward circuit.

3. An amplifier circuit configured for providing chopper stabilization while reducing residual offset errors, said operational amplifier circuit comprising:

an input stage having an input offset voltage and providing an output signal at output terminals configured for chopper stabilizaton;

a first switching block configured for chopper stabilizing of said amplifier circuit, said first switching block coupled to said input terminals of said input stage;

at least one following stage for providing an output signal;

a second switching block configured for chopper stabilizing of said amplifier circuit, said second switching block coupled to an input of said at least one following stage;

a second gain stage coupled between said input stage and said second switching block, wherein said second gain stage is configured such that any offset voltage occurring at an input of said second gain stage suitably appears at said output terminals of said input stage with identical polarity during each phase of chopper stabilization of said amplifier circuit, thus reducing any residual DC offset resulting from changes in voltage across parasitic capacitances on said output terminals of said input stage, and wherein said input stage comprises:

a pair of input transistor devices having gates coupled to said first switching block, and sources coupled to a first current source; and a first pair of folding cascode devices comprising a pair of transistors having gates connected together, sources coupled to drains of said pair of input transistor devices, and drains coupled to said output terminals of said input stage.

4. The amplifier circuit according to claim 3, wherein said input stage further comprises a pair of current source devices comprising a pair of transistors having gates connected together, sources coupled together, and drains coupled to said output terminals of said input stage.

5. The amplifier circuit according to claim 4, wherein each of said pair of input transistor devices and said pair of current source devices comprise a PMOS pair and said first pair of folding cascode devices comprise an NMOS pair.

6. The amplifier circuit according to claim 1, wherein said amplifier circuit further comprises an overall feedforward circuit comprising a second input pair of transistor devices having gates coupled to said first switching block, sources coupled to a second current source, and drains coupled to said following stage.

7. An amplifier circuit configured for providing chopper stabilization while reducing residual offset errors, said operational amplifier circuit comprising:

an input stage having an input offset voltage and providing an output signal at output terminals configured for chopper stabilization;

a first switching block configured for chopper stabilizing of said amplifier circuit, said first switching block coupled to said input terminals of said input stage;

at least one following stage for providing an output signal;

a second switching block configured for chopper stabilizing of said amplifier circuit, said second switching block coupled to an input of said at least one following stage; and a second gain stage coupled between said input stage and said second switching block, wherein said second gain stage is configured such that any offset voltage occurring at an input of said second gain stage suitably appears at said output terminals of said input stage with identical polarity during each phase of chopper stabilization of said amplifier circuit, thus reducing any residual DC offset resulting from changes in voltage across parasitic capacitances on said output terminals of said input stage, wherein said first switching block comprises a plurality of switches configured for two-phase, two input and two output operation, each of said plurality of switches comprising:

a PMOS transistor device and an NMOS transistor device, sources of which are coupled an input terminal and drains of which are coupled to an output terminal; and an inverter device having an input coupled to a gate of at least one of said PMOS transistor device and said NMOS transistor device and an inverted output coupled to a gate of another of said at least one of said PMOS transistor device and said NMOS transistor device.

8. An amplifier circuit configured for providing chopper stabilization while reducing residual offset errors, said operational amplifier circuit comprising:

an input stage having an input offset voltage and providing an output signal at output terminals configured for chopper stabilization;

a first switching block configured for chopper stabilizing of said amplifier circuit, said first switching block coupled to said input terminals of said input stage;

at least one following stage for providing an output signal;

a second switching block configured for chopper stabilizing of said amplifier circuit, said second switching block coupled to an input of said at least one following stage;

a second gain stage coupled between said input stage and said second switching block, wherein said second gain stage is configured such that any offset voltage occurring at an input of said second gain stage suitably appears at said output terminals of said input stage with identical polarity during each phase of chopper stabilization of said amplifier circuit, thus reducing any residual DC offset resulting from changes in voltage across parasitic capacitances on said output terminals of said input stage, and wherein said second switching block comprises:

an outer pair of transistors comprising a first transistor and a second transistor having second terminals connected together, said first transistor having a first terminal connected to a first input terminal and a third terminal connected to a second output terminal, said second transistor having a first terminal connected to a second input terminal and a third terminal connected to a first output terminal;

an inner pair of transistors comprising a third transistor and a fourth transistor having second terminals connected together, said third transistor having a first terminal connected to said first input terminal and a third terminal connected to said first output terminal, said fourth transistor having a first terminal connected to said second input terminal and a third terminal connected to said second output terminal; and wherein said second switching block is configured such that when said second terminals of said inner pair of transistors are in a high state, said second terminals of said outer pair of transistors are in a low state, said first input terminal is coupled to said first output terminal, and said second input terminal is coupled to said second output terminal.

9. The amplifier circuit according to claim 1, wherein said amplifier circuit further comprises a plurality of following stages configured in series to provide an amplifier output signal.

10. An amplifier circuit configured for providing chopper stabilization while reducing any residual offset errors, said amplifier circuit comprising:

an input stage configured for receiving an input voltage and providing an output signal configured for chopper stabilization;

a first switching block configured for chopping an input signal at a chopping frequency, said first switching block coupled between the input voltage signal and said input stage;

a following stage having a pair of input terminals and an output terminal;

a second switching block configured for modulation of an input offset voltage, said second switching block being coupled to said input terminal of said following stage;

a second gain stage coupled between said input stage and said second switching block, wherein said second gain stage is configured with said second switching block such that any offset voltage occurring at an input of said second gain stage suitably appears at an output terminal of said input stage with similar polarity during a first phase of chopper stabilization and a second phase of chopper stabilization of said amplifier circuit, thus reducing residual voltage offset errors; and a local feedforward circuit comprising a feedforward stage and a third switching block, said third switching block and said feedforward stage being coupled between an input of said second gain stage and said following stage, said local feedforward circuit being configured to increase stability within said amplifier circuit.

11. The amplifier circuit according to claim 10, wherein said third switching block comprises:

an outer pair of transistors comprising a first transistor and a second transistor having gates connected together, said first transistor having a source connected to a first input terminal and a drain connected to a second output terminal, said second transistor having a source connected to a second input terminal and a drain connected to a first output terminal;

an inner pair of transistors comprising a third transistor and a fourth transistor having gates connected together, said third transistor having a source connected to said first input terminal and a drain connected to said first output terminal, said fourth transistor having a source connected to said second input terminal and a drain connected to said second output terminal; and wherein said second switching block is configured such that when said gates of said inner pair of transistors are in a high state, said gates of said outer pair of transistors are in a low state, said first input terminal is coupled to said first output terminal, and said second input terminal is coupled to said second output terminal.

12. The amplifier circuit according to claim 10, wherein said input stage comprises:

a pair of Input transistor devices having gates coupled to said first switching block, and sources coupled to a first current source; and a first pair of folding cascode devices comprising a pair of transistors having gates connected together, sources coupled to drains of said pair of input transistor devices, and drains coupled to said output terminals of said input stage; and a second pair of active load devices comprising a pair of transistors having gates connected together, sources coupled together, and drains coupled to said output terminals of said input stage.

13. The amplifier circuit according to claim 12, wherein said input stage further comprises:

a second current source coupled between at least one of said sources of said first pair of folding cascode devices and ground; and a third current source coupled between another of said sources of said first pair of folding cascode devices and ground.

14. The amplifier circuit according to claim 10, wherein said amplifier circuit further comprises an overall feedforward circuit comprising a second input pair of transistor devices having gates coupled to said input voltage, sources coupled to a second current source, and drains coupled to said following stage.

15. The amplifier circuit according to claim 10, wherein said following stage comprises an output stage having a differential output terminal.

16. The amplifier circuit according to claim 10, wherein said second switching block comprises:

an outer pair of transistors comprising a first transistor and a second transistor having gates connected together, said first transistor having a source connected to a first input terminal and a drain connected to a second output terminal, said second transistor having a source connected to a second input terminal and a drain connected to a first output terminal;

an inner pair of transistors comprising a third transistor and a fourth transistor having gates connected together, said third transistor having a source connected to said first input terminal and a drain connected to said first output terminal, said fourth transistor having a source connected to said second input terminal and a drain connected to said second output terminal; and wherein said second switching block is configured such that when said gates of said inner pair of transistors are in a low state, said gates of said outer pair of transistors are in a high state, said first input terminal is coupled to said second output terminal, and said second input terminal is coupled to said first output terminal.

17. The amplifier circuit according to claim 10, wherein said second gain stage comprises an auto-zero stage having zero input offset voltage.

18. A method for correction of DC residual offset within a chopper stabilized amplifier circuit, said method comprising the steps of:

modulating an input signal with a first switching block coupled at an input terminal of an input stage;

receiving an output signal from said input stage into a second stage, said second stage being coupled to output terminals of said input stage;

providing an output signal from said second stage through a second switching block to a following stage, said second switching block configured for modulation of an input offset voltage and demodulation of said input signal;

forcing any offset voltage from said second stage to have identical polarity across said output terminals of said input stage such that DC residual offset resulting from changes in voltage across parasitic capacitances at said output terminals of said input stage; and feeding said output signal from said input stage through a feedforward circuit to said following stage to increase stability in said amplifier circuit.

19. A method according to claim 18, wherein said step of feeding said output signal from said input stage through a feedforward circuit further comprises the step of:

feeding said output signal from said Input stage through a third switching block to a feedforward stage, said third switching block configured to provide negative feedback through said feedforward circuit; and summing an output terminal of said feedforward stage with said following stage.

20. A method according to claim 19, wherein said method further comprises the step of:

coupling a second pair of input transistors to input terminals of said first switching block and into said following stage to provide compensation to said feedforward circuit to further increase stability in said amplifier circuit.

21. A method according to claim 18, wherein said step of forcing comprises forcing the same voltage polarity for offset voltage appearing differentially between parasitic capacitances at said output terminals of said input stage during each phase of chopper stabilization of said amplifier circuit.

* * * * *